(12) United States Patent
Kobata

(10) Patent No.: US 10,447,205 B2
(45) Date of Patent: Oct. 15, 2019

(54) OSCILLATION DEVICE AND METHOD FOR MANUFACTURING THE OSCILLATION DEVICE

(71) Applicant: NIHON DEMPA KOGYO CO., LTD., Tokyo (JP)

(72) Inventor: Tsukasa Kobata, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 416 days.

(21) Appl. No.: 15/505,109

(22) PCT Filed: Aug. 12, 2015

(86) PCT No.: PCT/JP2015/072838
§ 371 (c)(1),
(2) Date: Feb. 20, 2017

(87) PCT Pub. No.: WO2016/027741
PCT Pub. Date: Feb. 25, 2016

(65) Prior Publication Data
US 2019/0158023 A1 May 23, 2019

(30) Foreign Application Priority Data
Aug. 20, 2014 (JP) .................. 2014-167673

(51) Int. Cl.
*H03B 5/32* (2006.01)
*H03L 1/00* (2006.01)
(Continued)

(52) U.S. Cl.
CPC ............... *H03B 5/32* (2013.01); *H03L 1/00* (2013.01); *H03L 1/028* (2013.01); *H03L 1/04* (2013.01); *H03L 7/00* (2013.01)

(58) Field of Classification Search
CPC .... H03B 5/32; H03L 1/00; H03L 1/04; H03L 1/028
See application file for complete search history.

(56) References Cited

U.S. PATENT DOCUMENTS

| | | | | |
|---|---|---|---|---|
| 5,659,884 A | * | 8/1997 | Daughtry, Jr. | ........... H03B 5/32 331/158 |
| 7,015,762 B1 | * | 3/2006 | Nicholls | ................... H03L 1/00 331/10 |

(Continued)

FOREIGN PATENT DOCUMENTS

| | | |
|---|---|---|
| JP | 2003-168927 | 6/2003 |
| JP | 2004-282118 | 10/2004 |

(Continued)

OTHER PUBLICATIONS

"International Search Report (Form PCT/ISA/210)", dated Sep. 15, 2015, with English translation thereof, pp. 1-4.

*Primary Examiner* — Ryan Johnson
(74) *Attorney, Agent, or Firm* — JCIPRNET

(57) ABSTRACT

In an OCXO, which outputs an oscillation frequency by oscillating a crystal resonator, a correspondence relationship between an oscillation frequency and an elapsed time at a beginning after a start of oscillation of a first crystal resonator is acquired. Based on the acquired result, data after the beginning and corresponding to a correspondence relationship between an accumulated elapsed time of the oscillation and the oscillation frequency after the start of the oscillation is obtained. Based on the accumulated elapsed time of the oscillation and this data, a frequency setting value is corrected. While an output frequency of the first crystal resonator fluctuates in association with the elapsed time, the output frequency is corrected by the frequency correction (Continued)

value corresponding to the accumulated elapsed time, thereby stabilizing the oscillation frequency.

5 Claims, 6 Drawing Sheets

(51) Int. Cl.
*H03L 1/02* (2006.01)
*H03L 1/04* (2006.01)
*H03L 7/00* (2006.01)

(56) References Cited

U.S. PATENT DOCUMENTS

2012/0218048 A1* 8/2012 Akaike .................. H03L 1/00
331/2
2014/0077888 A1* 3/2014 Iwasa .................. H03B 5/04
331/66

FOREIGN PATENT DOCUMENTS

| JP | 2009-290380 | 12/2009 |
| JP | 2013-051676 | 3/2013 |
| JP | 2013-051677 | 3/2013 |
| JP | 2014-059167 | 4/2014 |

* cited by examiner

OSCILLATION DEVICE AND METHOD FOR MANUFACTURING THE OSCILLATION DEVICE

CROSS-REFERENCE TO RELATED APPLICATION

This application is a 371 of international application of PCT application Ser. No. PCT/JP2015/072838, filed on Aug. 12, 2015, which claims the priority benefit of Japan application no. 2014-167673, filed on Aug. 20, 2014. The entirety of each of the abovementioned patent applications is hereby incorporated by reference herein and made a part of this specification.

TECHNICAL FIELD

The present invention relates to an oscillation device of an Oven Controlled Crystal Oscillator (OCXO) type that stabilizes a temperature of an atmosphere where a piezoelectric resonator is placed using a heating unit.

BACKGROUND ART

In the case where high frequency stability is desired, such as a base station of mobile phones, for example, an OCXO shown in Patent Document 1 is employed as the most of oscillators. The OCXO keeps a constant temperature of an atmosphere where, for example, a crystal resonator as a piezoelectric resonator, which outputs an oscillation frequency, is placed using a heating unit. Therefore, the oscillation frequency is stable.

On the other hand, an output frequency in the oscillation device may change its oscillation frequency by the time due to such as a mass change caused by substances included in the atmosphere accumulating on the piezoelectric resonator. Conventionally, sufficient aging has been given to the piezoelectric resonator before shipping of a product to reduce an aged deterioration of the oscillation frequency in the market.

In the telecommunication industry, the area of space development, or similar field, a further stabilized oscillation frequency is desired. Therefore, in the case where aging is insufficient due to, for example, a limited delivery deadline when aging is performed to the piezoelectric resonator at a supplier side, there is a concern that a fluctuation of the oscillation frequency caused by an aged deterioration becomes a problem. There is also a concern that taking a long time for aging at the supplier side significantly burdens on speedy distribution of the product.

CITATION LIST

Patent Document

Patent Document 1: Japanese Unexamined Patent Application Publication No. 2013-51676

SUMMARY

Problems to be Solved

The present invention has been made under such circumstances, and an object thereof is to provide a technique capable of obtaining a stable oscillation output with a reduced secular change of an oscillation frequency in an oscillation device that uses a piezoelectric resonator.

Solutions to the Problems

An oscillation device of the present invention uses a piezoelectric resonator to obtain an oscillation output based on a frequency setting value. The oscillation device includes a storage unit, a time measurement unit, a correction value operator, and an addition unit. The storage unit stores a prediction data generated based on an acquired result of a correspondence relationship between an elapsed time and an oscillation frequency during a time period from after a start of oscillation of the piezoelectric resonator up to a preliminary set elapsed time. The prediction data corresponds to a correspondence relationship between the oscillation frequency and an accumulated elapsed time of the oscillation after the start of the oscillation, and the accumulated elapsed time includes a time after the preliminary set elapsed time. The time measurement unit is configured to measure the accumulated elapsed time of the oscillation after the start of the oscillation of the piezoelectric resonator. The correction value operator is configured to obtain a correction value of the frequency setting value based on the accumulated elapsed time of the oscillation measured in the time measurement unit and the prediction data stored in the storage unit. The addition unit is configured to obtain a corrected frequency setting value by adding the correction value obtained in the correction value operator to the frequency setting value.

Another invention is a method for manufacturing an oscillation device that uses a piezoelectric resonator to obtain an oscillation output based on a frequency setting value. The method includes: an acquiring step of acquiring an elapsed time and an oscillation frequency during a time period from after a start of oscillation of the piezoelectric resonator up to a preliminary set elapsed time; and a storing step of obtaining and storing a prediction data in a storage unit based on an acquired result acquired in the acquiring step. The prediction data corresponds to a correspondence relationship between the oscillation frequency and an accumulated elapsed time of the oscillation, and the accumulated elapsed time including a time after the preliminary set elapsed time. The prediction data stored in the storage unit is used to: obtain a correction value of the frequency setting value based on the prediction data and the accumulated elapsed time of the oscillation, and obtain a corrected frequency setting value by adding the obtained correction value to the frequency setting value.

Effects of the Invention

The present invention acquires a correspondence relationship between an oscillation frequency and an elapsed time at a beginning after a start of oscillation of a piezoelectric resonator, obtains prediction data after the beginning and corresponding to a correspondence relationship between an accumulated elapsed time of the oscillation and the oscillation frequency after the start of the oscillation based on the acquired result, and corrects a frequency setting value based on the accumulated elapsed time of the oscillation and this prediction data. Therefore, a secular change of the oscillation frequency is reduced and a stable oscillation output is obtained.

DESCRIPTION OF PREFERRED EMBODIMENTS

[Schematic Description of Embodiment]

Figure 1:
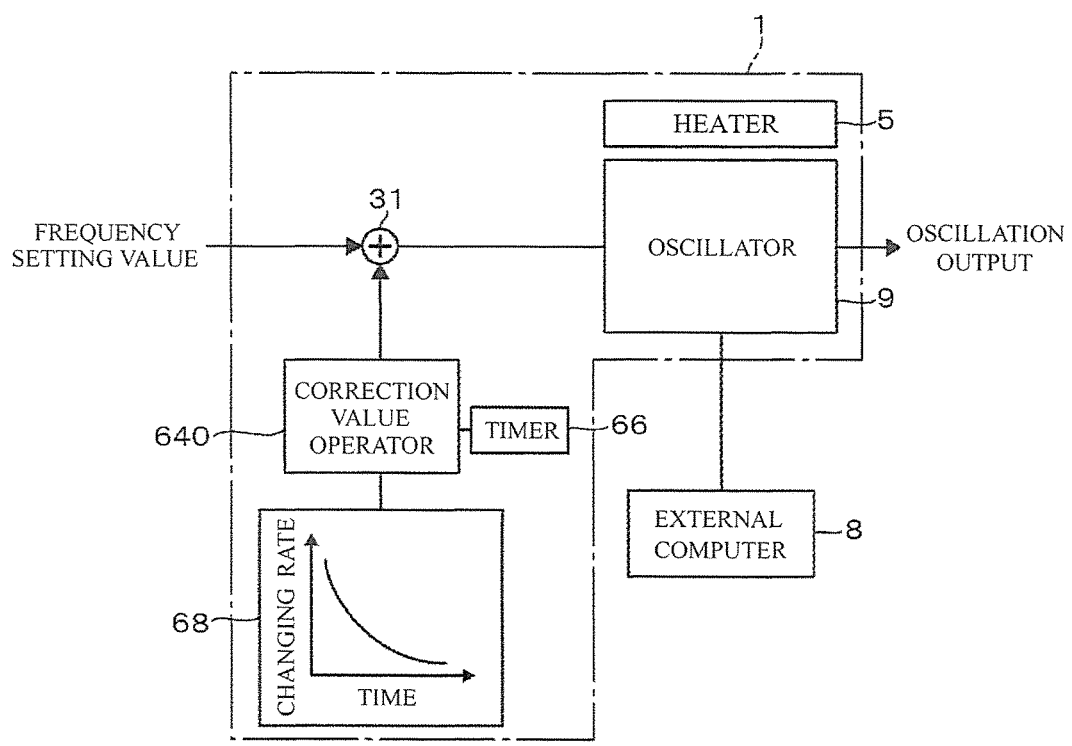
FIG. 1 is a block diagram illustrating an outline of an oscillation device according to an embodiment of the present invention.

FIG. 1 is a block diagram illustrating an outline of an embodiment of an oscillation device of the present invention. The present invention is directed to an oscillation device that uses a piezoelectric resonator, for example, a crystal resonator and is configured to obtain an oscillation output based on a frequency setting value. In FIG. 1, reference numeral 9 denotes an oscillator that uses a crystal resonator and obtains an oscillation output according to a frequency setting value that is input. A heater 5 as a heating unit heats an atmosphere where the crystal resonator is placed to a constant temperature. Therefore, an oscillation device 1 including this oscillator 9 is an OCXO.

As one example of the oscillator 9, for example, one that is constituted of a Colpitts circuit, and a control voltage of this Colpitts circuit is input via a variable capacitance diode can be included. In this case, the control voltage corresponds to the frequency setting value. An output frequency of the oscillator 9 is adjusted according to the control voltage. The crystal resonator, although it is slightly, changes an oscillation frequency according to an elapsed time after a start of oscillation (after a start of a current application). Because of this, a memory 68 as a storage unit stores data showing a relationship between an accumulated elapsed time of the oscillation and the frequency of the crystal resonator after the start of the oscillation. For example, a relationship between the accumulated elapsed time of the oscillation and a changing rate (for example, unit: ppb) of the oscillation frequency then with respect to the oscillation frequency at a time point when the oscillation is started.

This frequency aging data is generated based on the accumulated elapsed time and the oscillation frequency after the start of the oscillation by oscillating the crystal resonator for a short period of time, such as one month, to detect the oscillation frequency at predetermined time intervals, such as one hour intervals, for the one month. Accordingly, this data is prediction data. For example, an external computer 8 is connected to the oscillation device 1. This external computer 8 detects the oscillation frequency via a frequency detecting unit (not illustrated) to generate the prediction data of the frequency aging and transmits to the memory 68 of the oscillation device 1. Based on the prediction data of the frequency aging in the memory 68 and the accumulated elapsed time of the oscillation of the crystal resonator managed by a timer 66 as a part of a time measurement unit, a correction value operator 640 reads a frequency changing rate corresponding to this accumulated elapsed time to obtain a correction value with respect to the frequency setting value. The correction value operator 640, the timer 66, and the memory 68 correspond to a correction value output unit 6 in FIG. 2 described later.

With the relationship between the frequency changing rate and a change of the oscillation output of the oscillation device 1 is obtained in advance, the correction value operator 640 obtains how much correction is necessary for the frequency setting value based on this relationship and the read frequency changing rate. The obtained correction value is added to the frequency setting value in an addition unit 31, and a corrected frequency setting value is input to the oscillator 9.

The oscillation device is not limited to the example described above. As a concrete example described later, there is one that generates a reference signal of a PLL circuit unit based on a frequency signal output from a Direct Digital Synthesizer (DDS) or uses this frequency signal as the reference signal of the PLL circuit unit, so as to make an output of a voltage control oscillator (VCXO: Voltage Controlled Crystal Oscillator) disposed in a loop including the PLL circuit unit as an output of an oscillation device. In this case, the DDS is driven using an output of the oscillator circuit that oscillates a crystal resonator as a clock. An input value for setting an output frequency of the DDS becomes a frequency setting value. A correction value is obtained for compensating a secular change of an oscillation frequency of the crystal resonator. This correction value is added to the frequency setting value. Next, a concrete example of such oscillation device is described.

[Details of Concrete Example of Embodiment]

Figure 2:
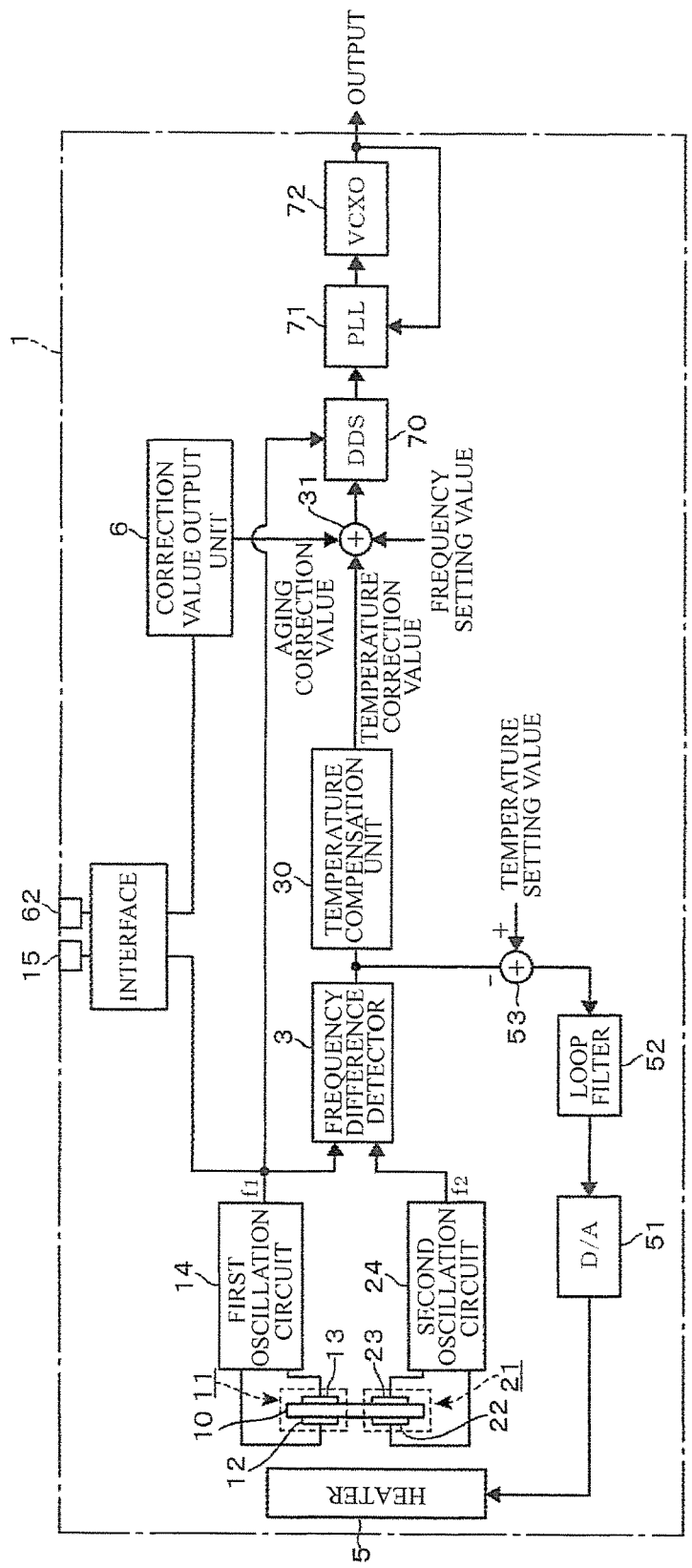
FIG. 2 is a block diagram illustrating a concrete example of the oscillation device according to the embodiment of the present invention.

FIG. 2 is an overall block diagram more specifically illustrating the embodiment of the oscillation device of the present invention. This oscillation device includes a first crystal resonator 11 and a second crystal resonator 21. These first crystal resonator 11 and second crystal resonator 21 use, for example, a common strip-shaped crystal element 10. Both front and back surfaces of respective divided regions (vibrating regions) are constituted so as to provide electrodes 12 and 13 (22 and 23) for excitation.

The first crystal resonator 11 and the second crystal resonator 21 are connected to a first oscillator circuit 14 and a second oscillator circuit 24, respectively. Outputs of these first and second oscillator circuits 14 and 24 are, for example, overtones (higher harmonics) of the first and the second crystal resonators 11 and 21. In this example, it is configured to use a signal corresponding to a difference between both frequencies as a temperature detection signal. The first crystal resonator 11 and the second crystal resonator 21 can be a part of a temperature detector. This temperature detector is used to control a supplied electricity of the heater 5 included in the oscillation device 1 described later. The first crystal resonator 11 and the first oscillator circuit 14 are used as the clock of a DDS 70. In this example, taking a secular change of an oscillation frequency of the first crystal resonator 11 as a matter, a frequency correction value that matches this secular change is obtained.

First, the temperature detector and a control circuit unit of the heater 5 are described. In FIG. 2, reference numeral 3 denotes a frequency difference detector. This frequency difference detector 3 is schematically mentioned as a circuit unit for taking out a frequency difference detection value $f2-f1-\Delta fr$. The frequency difference detection value is a difference between: a difference between an oscillation frequency $f1$ of the first oscillator circuit 14 and an oscillation frequency $f2$ of the second oscillator circuit 24, and a $\Delta fr$. The $\Delta fr$ is a difference between $f1$ ($f1r$) and $f2$ ($f2r$) at a reference temperature, for example, 25° C. Accordingly, the frequency difference detection value is a value based on a frequency change caused by a temperature change from the reference temperature and can be said as a temperature detection value.

A latter part of the frequency difference detector 3 includes an addition unit 53. The addition unit 53 reads a temperature setting value to operate a difference between the temperature setting value and the frequency difference detection value. As illustrated in FIG. 2, a latter part of the addition unit 53 includes a loop filter 52 corresponding to an integration circuit unit. Furthermore, a latter part of the loop filter 52 includes a digital/analog (D/A) converter 51. The D/A converter 51 inputs a DC voltage corresponding to a digital signal to the heater 5. Accordingly, a temperature of an atmosphere where the first and the second crystal resonators 11 and 21 are placed is controlled by the addition unit 53, the loop filter 52, the D/A converter 51, and the heater 5.

Next, a unit corresponding to the oscillator 9 illustrated in FIG. 1 will be described. In FIG. 2, a latter part of the DDS 70 is connected to a PLL circuit unit 71. The PLL circuit unit 71 is connected to a voltage control oscillator 72. The PLL circuit unit 71 includes, for example, a dividing circuit, a phase difference circuit that takes out a difference between a phase of a reference signal from the DDS 70 and a phase of a frequency signal from the dividing circuit, and a circuit unit that integrates a phase difference signal taken out in the phase difference circuit to configure a part of the PLL. An output of the voltage control oscillator 72 corresponds to the output of the oscillation device 1. The DDS 70 receives a frequency setting value and outputs a frequency signal of a frequency corresponding to the frequency setting value.

The frequency setting value, in this example, is added with a temperature correction value and a secular change correction value in the addition unit 31. The temperature correction value is a correction amount for compensating a frequency change based on a temperature change of the first crystal resonator 11. The secular change correction value is a correction amount for compensating a frequency change based on a secular change of the first crystal resonator 11. A signal corresponding to a difference between the oscillation frequencies of the first oscillator circuit 14 and the second oscillator circuit 24, which is a frequency difference detection signal of the frequency difference detector 3, corresponds to a temperature. Thus, the temperature correction value is obtained based on the frequency difference detection signal and a frequency versus temperature characteristic (a relationship between a temperature and a changing rate of a frequency with respect to a frequency at a reference temperature) of the first crystal resonator 11.

The secular change correction value will be described. In a memory (not illustrated) in the external computer 8, which corresponds to an external parameter setting unit, illustrated in FIG. 3, data (prediction data) of frequency aging is stored. The data shows a correspondence relationship between an accumulated elapsed time and an oscillation frequency of the oscillation of the first crystal resonator 11 after the start of the oscillation. FIG. 4 illustrates one example of this data. The horizontal axis is the accumulated elapsed time after the start of the oscillation. The vertical axis is a changing rate of the oscillation frequency then with respect to the oscillation frequency at a time point when the oscillation is started. A relationship between the accumulated elapsed time and the changing rate of the oscillation frequency is approximated by Formula (1).

$$\text{The changing rate of the oscillation frequency} = A \times (1 - \exp(-t/\tau)) \quad \text{Formula (1)}$$

In this Formula (1), an aging saturation value A and a time constant τ are rewritable by the external computer 8. That is, in this example, the frequency aging data is generated by the external computer 8 and transmitted to the memory 68. The generation of this data will be described. An operator connects a frequency detecting unit 81 connected to the external computer 8 outside the oscillation device 1 to an output side of the first oscillator circuit 14 via a connection terminal portion 15 and an interface 61. The operator also connects the external computer 8 to a correction operation circuit 6 (the correction value output unit) via the connection terminal portion 62 and the interface 61. Then, the oscillation device 1 is driven to sample the oscillation frequency of the first crystal resonator 11, for example, every one hour for one month after an application of power source (after the start of the oscillation).

There is a case where the oscillation frequency becomes unstable for a certain time after the start of the power source. Therefore, for example, sampling of the oscillation frequency is waited until after 24 hours elapses and performed after then. The data of the frequency aging is expressed as an exponential function in this example. Thus, based on data from the start of the oscillation up to one month, the exponential function corresponding to data of the secular change that includes even after one month is predicted and obtained. Specifically, the aging saturation value A and the time constant τ of Formula (1) are obtained. The obtained data is transmitted to the memory 68 of the oscillation device 1. One example includes that the aging saturation value A is, for example, 10 ppb and the time constant T is set to 1440 hours. In this example, the first crystal resonator 11 is oscillated for one month (720 hours) in order to obtain the frequency aging data. This accumulated elapsed time of 720 hours is stored in the memory 68 of the oscillation device 1.

Figure 3:
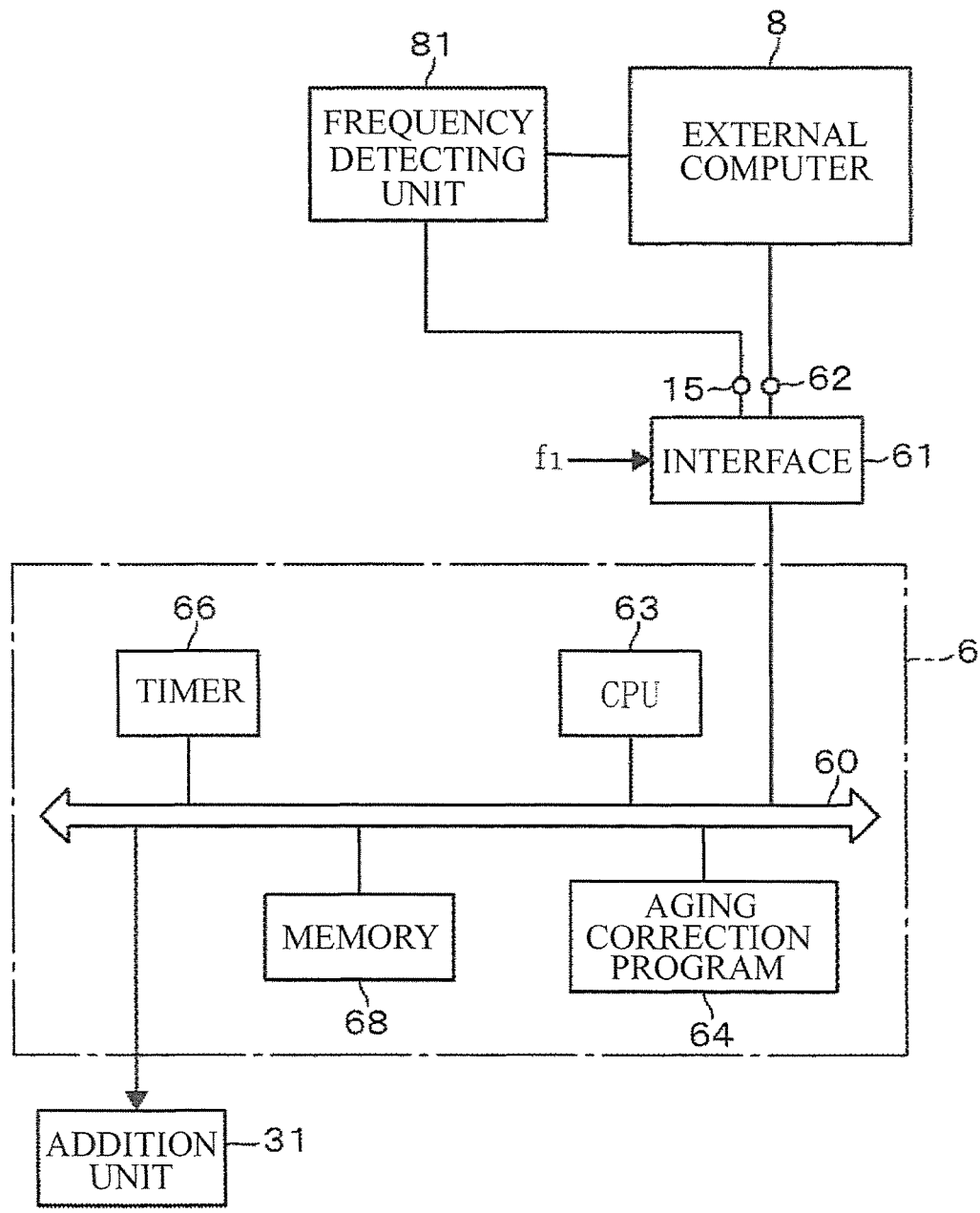
FIG. 3 is a block diagram illustrating a correction value output unit of an OCXO (oscillation device) according to the embodiment of the present invention.
Figure 4:
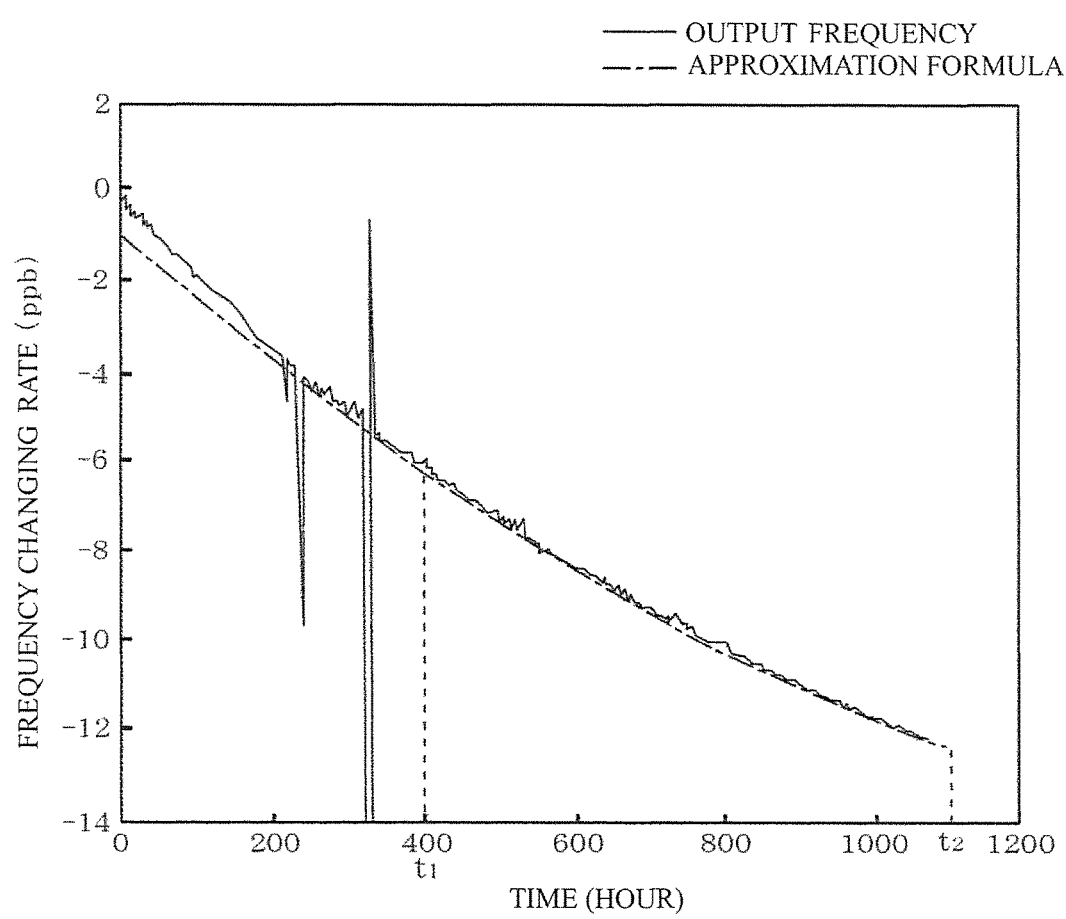
FIG. 4 is a characteristic diagram illustrating a secular change of an oscillation frequency of a first crystal resonator.

As illustrated in FIG. 3, the correction value output unit 6 includes the timer 66, which doubles as a time measurement unit that measures an accumulated time of the oscillation of the first crystal resonator 11 after the start of the oscillation, an aging correction program 64, which corresponds to a correction value operator for obtaining a secular change correction value, and a CPU 63, which is for executing the program 64. A bus 60 is connected to the memory 68. As described above, while the frequency aging data is acquired by the external computer 8, the accumulated elapsed time of the oscillation of the first crystal resonator 11 is counted, and when the power source is turned off after finishing a data acquisition operation by the external computer 8, the 720 hours of accumulated elapsed time is written in the memory 68.

The timer 66 counts, for example, the output frequency of the first oscillator circuit 14 as a clock. After outputting the secular change correction value, when the number of clocks corresponding to a set period, such as one hour, is counted, the timer 66 counts up to output a count up signal. The program 64 assigns the accumulated elapsed time then to the above-described Formula (1) based on the count up signal from the timer 66 to calculate a frequency changing rate of the first crystal resonator 11. The program 64 obtains the secular change correction value corresponding to this frequency changing rate to output the secular change correction value to the addition unit 31. The secular change correction value corresponding to the frequency changing rate is obtained, for example, by multiplying a preliminary obtained coefficient to the frequency changing rate.

Figure 5:
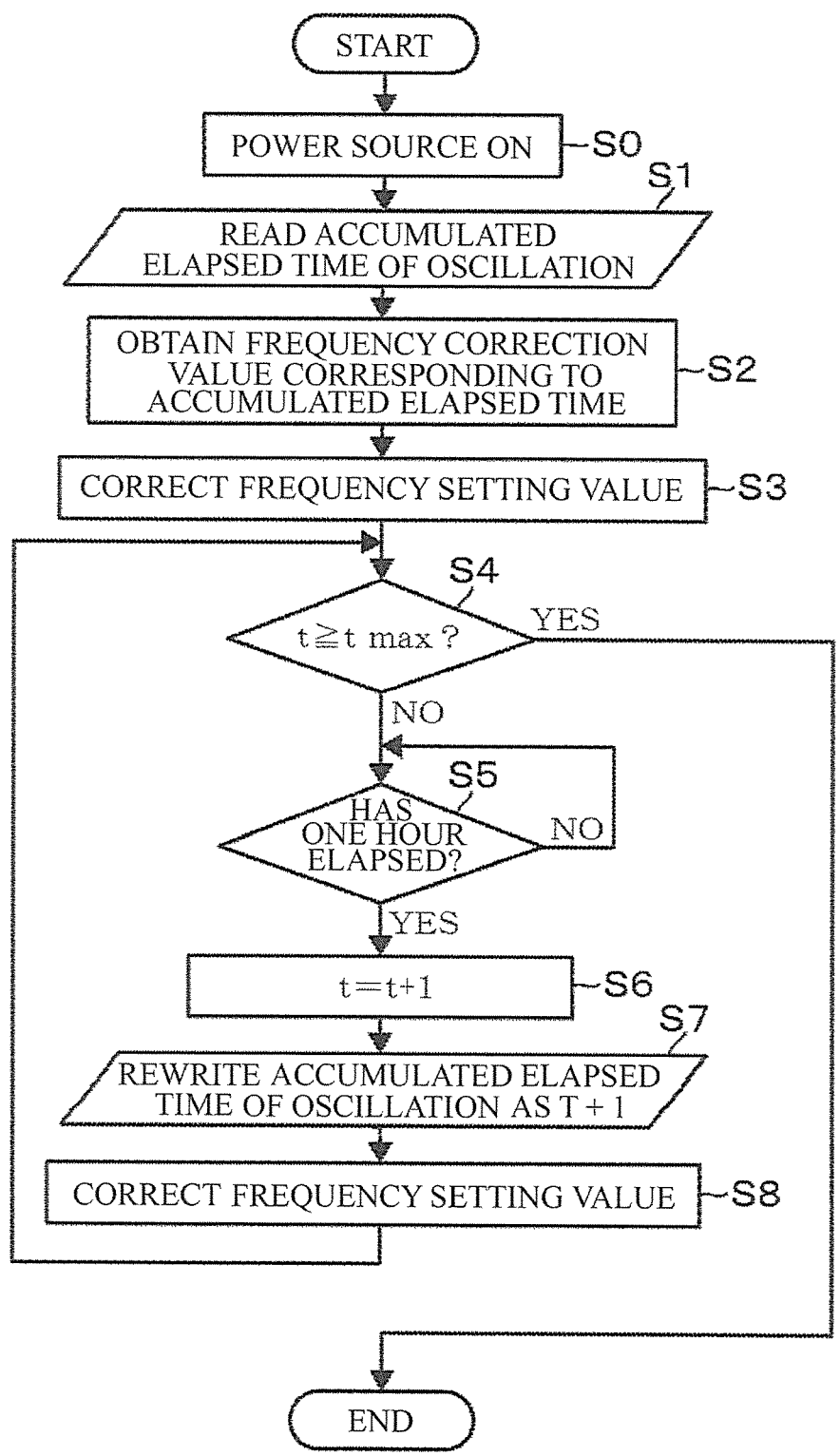
FIG. 5 is a chart diagram describing an operation of the OCXO according to the embodiment of the present invention.

Next, an operation of the above-described embodiment will be described with reference to a flowchart in FIG. 5. The memory 68 of the correction value output unit 6 of the oscillation device 1 stores Formula (1) already obtained, for example, at the supplier side. When, for example, the power source of the oscillation device 1 is turned on at a user side (Step S0), the first and the second oscillator circuits 14 and 24 oscillate and the accumulated elapsed time of the oscillation stored in the memory 68 is read out as Step S1.

In this example, as described above, the read out accumulated elapsed time is 720 hours (one month). Based on this accumulated elapsed time and the data corresponding to Formula (1) stored in the memory 68, the frequency changing rate of the first crystal resonator 11 is calculated to obtain the secular change correction value corresponding to this frequency changing rate (Step S2), and the secular change correction value is output to the addition unit 31 to correct the frequency setting value (Step S3). From a temperature compensation unit 30, the temperature correction value is always output. The temperature correction value is, for example, added to the frequency setting value. Since the above-described Formula (1) is the exponential function, when the accumulated elapsed time becomes considerably long, the frequency changing rate becomes approximately constant. Therefore, the accumulated elapsed time is determined in advance as the maximum period and stored in the memory 68 as tmax. When the accumulated elapsed time exceeds tmax, the secular change correction is stopped. Therefore, Step S4 is included.

Meanwhile, the timer 66 is driven when the secular change correction value is output at Step S3. When the timer 66 counts up after one hour elapses, that is, a count up signal is output upon "YES" at determination Step S5. This adds one hour to the accumulated elapsed time stored in the memory 68 (Steps S6 and S7). Then, based on the accumulated elapsed time (721 hours) and the data corresponding to Formula (1) stored in the memory 68, the frequency changing rate of the first crystal resonator 11 is calculated to obtain the secular change correction value corresponding to this frequency changing rate, and similarly, the frequency setting value is corrected (Step S8). This operation is subsequently repeated, until the accumulated elapsed time becomes tmax, to correct the frequency setting value every one hour.

Figure 6:
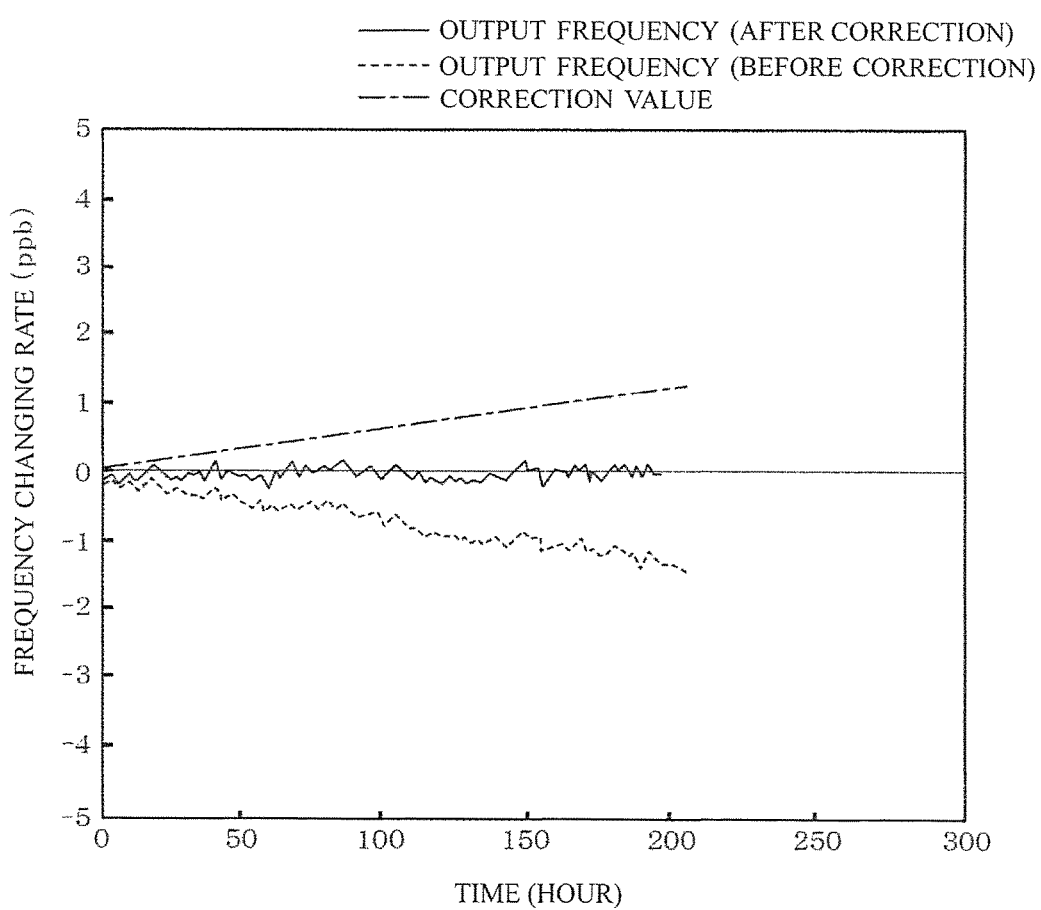
FIG. 6 is a characteristic diagram illustrating a secular change of an output frequency of the OCXO according to the embodiment of the present invention.

FIG. 6 illustrates a changing rate of the oscillation frequency in the case where a secular change of the oscillation frequency of the first crystal resonator 11 is not corrected, prediction data illustrating the relationship between the oscillation frequency and the accumulated elapsed time, and a changing rate of the oscillation frequency in the case where a correction of the secular change is performed using this prediction data, as an image.

According to the above-described embodiment, a correspondence relationship between the oscillation frequency and the accumulated elapsed time of the first crystal resonator 11 at the beginning after the start of the oscillation is acquired. Based on the acquired result, the prediction data including thereafter and corresponding to the correspondence relationship between the accumulated elapsed time and the oscillation frequency of the oscillation after the start of the oscillation is obtained. Based on the accumulated elapsed time of the oscillation and this prediction data, the frequency setting value is corrected. Therefore, the secular change of the oscillation frequency of the first crystal resonator 11 can be reduced, thereby obtaining a stable oscillation output from the oscillation device 1.

In the above-described example, while Formula (1) is used as the prediction data showing the relationship between the accumulated elapsed time and the oscillation frequency of the oscillation after the start of the oscillation, storing data that matches the accumulated elapsed tune and a numerical value of the changing rate of the oscillation frequency in the memory 68 as a table may be employed as the prediction data. In this application, such a case also corresponds to operating the correction value. The case where the accumulated elapsed time and the correction value of the changing rate of the oscillation frequency are stored in the memory 68 as the table and the correction value is read out based on the accumulated elapsed time, also corresponds to obtaining the correction value of the frequency setting value based on the accumulated elapsed time of the oscillation and the prediction data stored in the storage unit.

Upon performing the correction of the changing rate of the oscillation frequency, for example, every one hour, the memory 68 stores the correction value of the changing rate of the oscillation frequency every 24 hours (one day). For the correction of the changing rate of the oscillation frequency every 24 hours, the correction is performed by reading the correction value from the memory 68. Interpolation values interpolated between the correction values of every 24 hours are stored in the memory 68. The interpolation value may be employed for the correction of every one hour. As a method for interpolating data, for example, the linear approximation method and the least-square method can be employed. Such configuration has an advantage that it requires a small capacity in the memory 68.

Furthermore, a formula used as the prediction data is not limited to the exponential function as shown in Formula (1), but it may combine two formulas of exponential functions as Formula (2) shows.

$$\text{The changing rate of the oscillation frequency} = A1 \times (1-\exp(-t/\tau)) + A2 \times (1-\exp(-t/\tau)) \quad \text{Formula (2)}$$

Furthermore, it may combine an exponential function and a linear expression as Formula (3) shows.

$$\text{The changing rate of the oscillation frequency} = A \times (1-\exp(-t/\tau)) + Bt \quad \text{Formula (3)}$$

The invention claimed is:

1. An oscillation device that uses a piezoelectric resonator to obtain an oscillation output based on a frequency setting value, the oscillation device comprising:
    a storage unit, storing a prediction data generated based on an acquired result of a correspondence relationship between an elapsed time and an oscillation frequency during a time period from after a start of oscillation of the piezoelectric resonator up to a preliminary set elapsed time, the prediction data corresponding to a correspondence relationship between the oscillation frequency and an accumulated elapsed time of the oscillation after the start of the oscillation, and the accumulated elapsed time including a dine after the preliminary set elapsed time;
    a time measurement unit, configured to measure the accumulated elapsed time of the oscillation after the start of the oscillation of the piezoelectric resonator;
    a correction value operator, configured to obtain a correction value of the frequency setting value based on the accumulated elapsed time of the oscillation measured in the time measurement unit and the prediction data stored in the storage unit; and
    an addition unit, configured to obtain a corrected frequency setting value by adding the correction value obtained in the correction value operator to the frequency setting value.

2. The oscillation device according to claim 1, wherein the piezoelectric resonator is a crystal resonator, and a relationship between the accumulated elapsed time and the oscillation frequency is an exponential function.

3. The oscillation device according to claim 1, comprising:
- a PLL circuit unit that includes a voltage control oscillating unit; and
- a DDS configured to output a reference frequency signal for the PLL circuit unit by having the frequency setting value input, the reference frequency signal corresponding to the frequency setting value, wherein
- the piezoelectric resonator is used as an operation clock of the DDS.

4. The oscillation device according to claim 2, comprising:
- a PLL circuit unit that includes a voltage control oscillating unit; and
- a DDS configured to output a reference frequency signal for the PLL circuit unit by having the frequency setting value input, the reference frequency signal corresponding to the frequency setting value, wherein
- the piezoelectric resonator is used as an operation clock of the DDS.

5. A method for manufacturing an oscillation device that uses a piezoelectric resonator to obtain an oscillation output based on a frequency setting value, the method comprising:
- an acquiring step of acquiring an elapsed time and an oscillation frequency during a time period from after a start of oscillation of the piezoelectric resonator up to a preliminary set elapsed time; and
- a storing step of obtaining and storing a prediction data in a storage unit based on an acquired result acquired in the acquiring step, the prediction data corresponding to a correspondence relationship between the oscillation frequency and an accumulated elapsed time of the oscillation, and the accumulated elapsed time including a time after the preliminary set elapsed time, wherein
- the prediction data stored in the storage unit is used to: obtain a correction value of the frequency setting value based on the prediction data and the accumulated elapsed time of the oscillation, and obtain a corrected frequency setting value by adding the obtained correction value to the frequency setting value.

* * * * *